United States Patent
Roshan et al.

(10) Patent No.: US 7,605,011 B2
(45) Date of Patent: Oct. 20, 2009

(54) SEMICONDUCTOR DEVICE AND A METHOD OF MANUFACTURING A SEMICONDUCTOR DEVICE

(75) Inventors: Rakesh Roshan, Oxford (GB); Brendan Poole, Oxford (GB); Stewart Edward Hooper, Oxfordshire (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 274 days.

(21) Appl. No.: 11/782,150

(22) Filed: Jul. 24, 2007

(65) Prior Publication Data

US 2007/0263691 A1    Nov. 15, 2007

Related U.S. Application Data

(62) Division of application No. 10/815,603, filed on Apr. 1, 2004, now Pat. No. 7,263,115.

(30) Foreign Application Priority Data

Apr. 2, 2003   (GB) ................. 0307555.3

(51) Int. Cl.
    *H01L 21/00* (2006.01)
(52) U.S. Cl. ............... 438/35; 438/31; 438/32; 438/37
(58) Field of Classification Search .......... 438/31, 438/32, 35, 37
    See application file for complete search history.

(56) References Cited

U.S. PATENT DOCUMENTS

| 5,091,915 | A |   | 2/1992  | Tatsumi et al. |          |
|-----------|---|---|---------|----------------|----------|
| 6,002,701 | A | * | 12/1999 | Kan et al.     | 372/46.01 |
| 6,014,394 | A | * | 1/2000  | Tomita         | 372/45.01 |
| 6,072,817 | A |   | 6/2000  | Adachi et al.  |          |
| 6,118,800 | A |   | 9/2000  | Kidoguchi et al. |        |
| 6,151,348 | A |   | 11/2000 | Adachi et al.  |          |

(Continued)

FOREIGN PATENT DOCUMENTS

JP    09-232685    9/1997

(Continued)

OTHER PUBLICATIONS

European Search Report regarding Application No. 04270002.1 dated Jun. 9, 2005.

(Continued)

*Primary Examiner*—Fernando L Toledo
(74) *Attorney, Agent, or Firm*—Renner, Otto, Boisselle & Sklar, LLP

(57) ABSTRACT

A semiconductor device comprises an active region (4), a cladding layer (5,7), and a saturable absorbing layer (6) disposed within the cladding layer. The saturable absorbing layer comprises at least one portion (11a) that is absorbing for light emitted by the active region and comprises at least portion (11b) that is not absorbing for light emitted by the active region.

The fabrication method of the invention enables the non-absorbing portion(s) (11b) of the saturable absorbing layer (6) to produced after the device structure has been fabricated. This allows the degree of overlap between the non-absorbing portion(s) (11b) of the saturable absorbing layer (6) and the optical mode of the laser to be altered after the device has been grown.

15 Claims, 6 Drawing Sheets

U.S. PATENT DOCUMENTS

| | | | |
|---|---|---|---|
| 6,580,740 B2 | 6/2003 | Funabashi et al. | |
| 6,614,824 B2 * | 9/2003 | Tsuda et al. | 372/46.01 |
| 6,839,369 B2 | 1/2005 | Iwai et al. | |
| 2002/0146048 A1 | 10/2002 | Kobayashi | |

FOREIGN PATENT DOCUMENTS

| | | |
|---|---|---|
| JP | 09-283850 | 10/1997 |

OTHER PUBLICATIONS

Onishi T. et al.; "Doping Level and Type of GaInP Saturable Absorbing Layers for Realizing Pulsating 650-nm-Band AlGaInP Laser Diodes"; IEEE Photonics Technology Letters, IEEE, Inc., New York, USA; vol. 10, No. 10; Oct. 1998; pp. 1368-1370; XP000786657.

Camacho F. et al.; "Improvements in Mode-Locked Semiconductor Diode Lasers using Monolithically Integrated Passive Waveguides made by Quantum-well Intermixing"; IEEE Photonics Technology Letters, IEEE, Inc. New York, USA; vol. 9, No. 9; Sep. 1997; pp. 1208-1210; XP000721218.

* cited by examiner

⊖ TQW
△ Active region

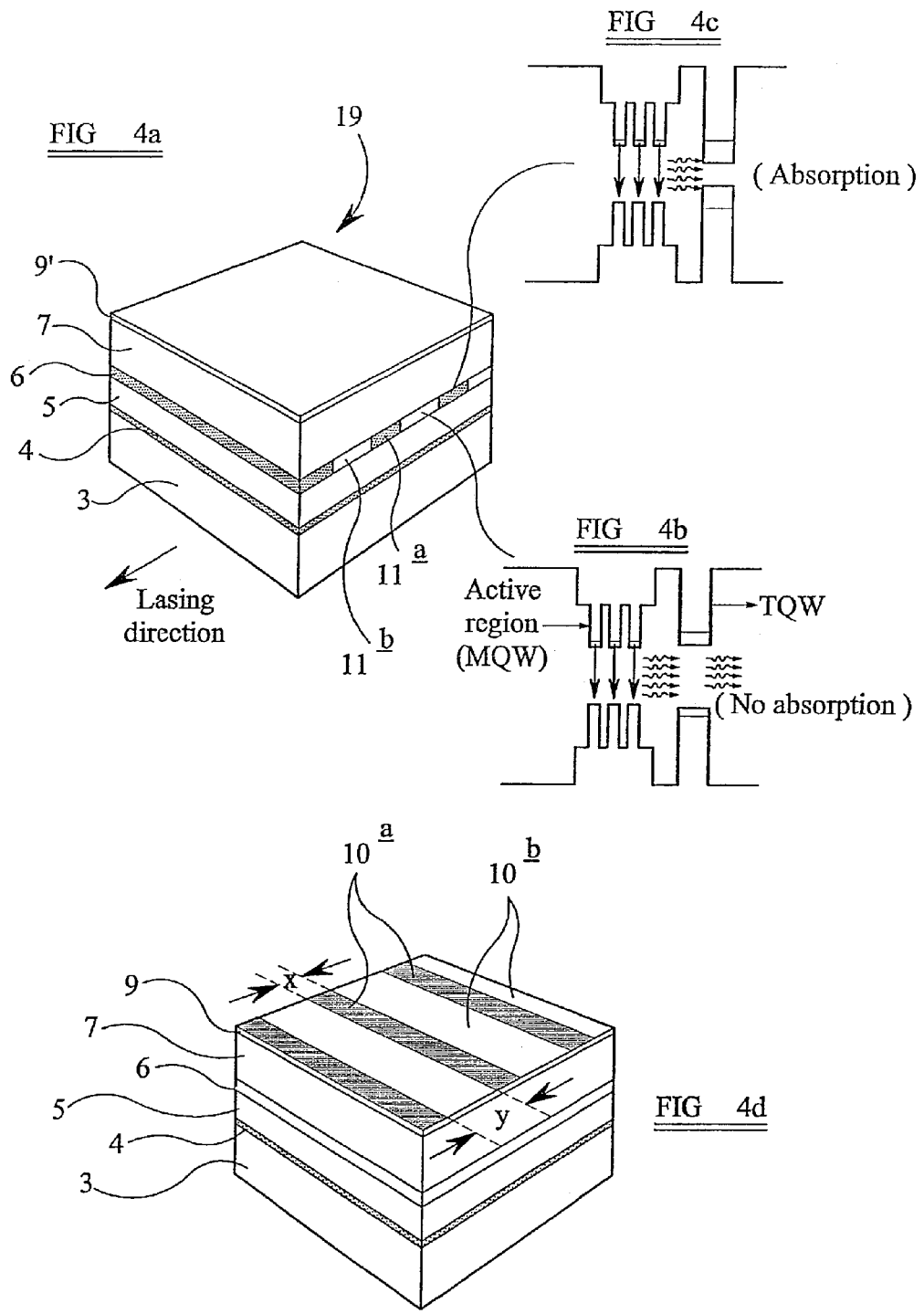

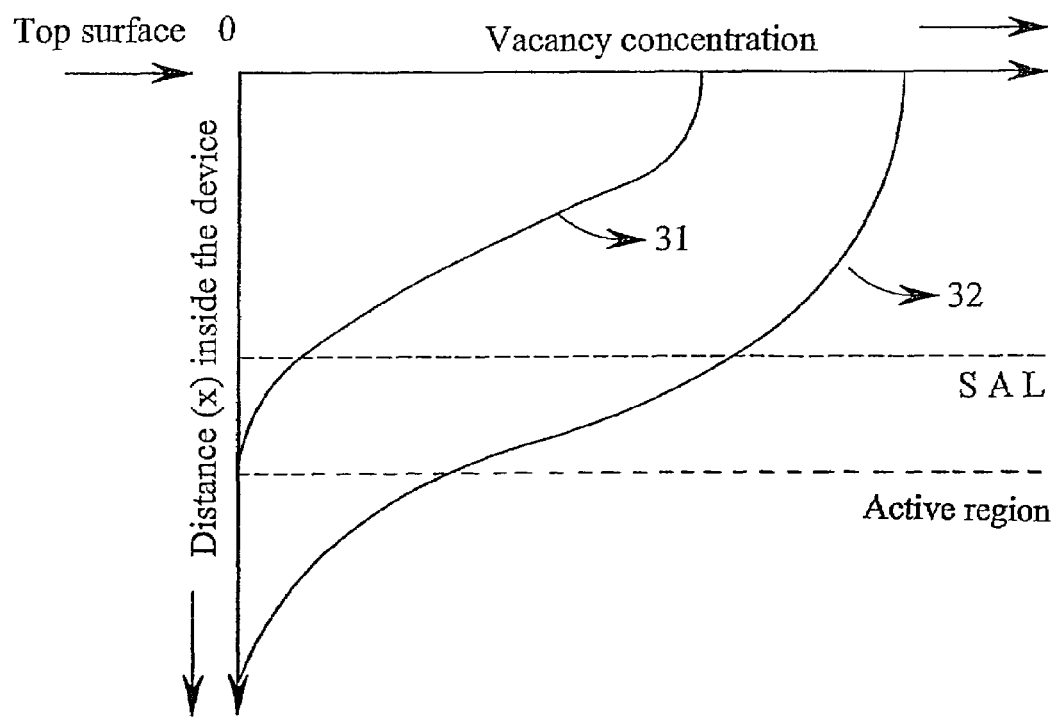

SEMICONDUCTOR DEVICE AND A METHOD OF MANUFACTURING A SEMICONDUCTOR DEVICE

This application is a divisional of U.S. patent application Ser. No. 10/815,603 filed on Apr. 1, 2004, now U.S. Pat. No. 7,263,115 which is hereby incorporated herein by reference in its entirety.

FIELD OF THE INVENTION

This Nonprovisional application claims priority under 35 U.S.C. § 119(a) on Patent Application No. 0307555.3 filed in Great Britain on Apr. 2, 2003, the entire contents of which are hereby incorporated by reference.

The present invention relates to semiconductor device, in particular to a laser device such as, for example, a self-pulsation laser device. It also relates to a method of manufacturing a semiconductor laser device.

BACKGROUND OF THE INVENTION

One common use of a semiconductor laser device is to record data onto or read data from an optical storage medium such as an optical disc. One problem encountered in this use is that, when reading data from or recording data to an optical disc, a fraction of the light emitted by the laser is reflected by the optical disc and is coupled back into the laser. The reflected light and the laser beam interfere optically, and this interference cause instabilities in the laser cavity which result in the generation of noise in the laser's output power.

One proposal for overcoming this problem is to use an optical arrangement which minimises the amount of light coupled back into the laser by separating the illumination optics from the collection optics. However, this leads to a much heavier, larger and more expensive optical arrangement.

Another proposal for overcoming this problem is to drive a laser according to a method known as the "high frequency overlapping method". In this method, a current oscillating at a high frequency is superimposed on the driving current of a semiconductor laser device. The high-speed modulation caused by the high frequency current destroys the phase coherence between the oscillating modes of the laser and any light reflected back to the laser by the optical disc, thereby rendering the laser insensitive to the optical feedback. This method has the disadvantage, however, that extra circuitry is required to bias and modulate the laser diode at a high frequency and this complicates the overall system and makes it much more expensive. Also, this method does not allow the miniaturisation of an optical set-up that uses a semiconductor laser.

Another approach to solving the problem has been to use a self-pulsating laser diode that use a direct current (DC) unmodulated drive current. Such a laser device offers low noise characteristics for optical disc reading/writing systems, by reducing the relative intensity of noise arising from the optical feedback from an optical disc.

The basic principle of a self-pulsation semiconductor laser is that the laser structure contains a layer or region that is absorbing for light emitted by the active region of the laser. Initially carriers are confined in the absorbing layer/region and are allowed to accumulate in the absorbing layer/region after it absorbs light generated in the active region. The accumulation of carriers in the absorbing layer/region causes a drop in its absorption coefficient—i.e., the absorbing saturates. This reduces the loss in the cavity of the laser device, and so leads to the sudden onset of a strong laser pulse as the photon density in the cavity rises above the threshold for laser action. The device quickly stops lasing as the intense lasing mode rapidly depletes the carriers in the active region, replenishing the absorption coefficient of the laser cavity to its original value. This cycle repeats itself, and hence self-pulsation is achieved.

ACKNOWLEDGEMENT OF THE PRIOR ART

One method of achieving self-pulsation, disclosed in U.S. Pat. No. 6,002,701, is to include a saturable absorbing layer in the laser structure. In general this method involves growing a quantum well layer near the active region (normally in a cladding layer of the laser), so that the quantum well layer overlaps with an optical mode propagating in the laser. By adjusting the thickness of the quantum well layer, the effective band gap of the quantum well may be set below or above the band-gap energy of the active region, thereby determining whether or not the quantum well layer absorbs light generated in the active region. Similarly Kidoguci et al. suggest, in "Appl. Phys. Lett." Vol. 68 (25) (1996), providing a highly doped saturable absorbing layer above the active layer of a semiconductor laser device in order to obtain self-pulsation in AlGaInP laser devices.

Self-pulsating laser diodes in which a p-type doped multiple quantum well acts as an absorbing layer and which operate at temperatures of up to 100° C. have been reported by H. D. Summers et al. in "IEEE Photonics Technology Letters", Vol. 10, No. 9 (1998).

Self-pulsation in a semiconductor laser device has also been achieved by adjusting the absorption in the lateral direction around the active layer. C. H. Henry et al. in "J. Appl. Phys." Vol. 52, p 4457 (1981); J. Manning et al. in "IEEE J. Quantum Electronics", Vol. QE-19, p 1525 (1993); and N. K. Dutta et al. in "Appl. Phys. Lett." Vol. 45, p 836 (1984) have reported a change of the refractive index in the lateral direction, owing to current injection, in multiquantum well (MQW) and double heterostructure lasers. H. Hayashi et al. showed, in "IEICE Technical report on Optical and Quantum Electronics" Vol. OQE88-5, p 33 (1998)), that this change of refractive index in the lateral direction, which is also evidence of a change in the band gap of the active layer, is an important factor for obtaining self-sustained pulsation in laser diodes. T. Tanaka et al. reported, in "Appl. Phys. Lett." Vol. 53(25), p 2471 (1984), fabricating high power self-sustained pulsating lasers using this technique, by optimising the thickness of the cladding layer and the active region.

FIG. 1 is a schematic view of a self-pulsation semiconductor laser device 17. The laser device 17 comprises a substrate 1, and a multi-layer structure 16 grown over the substrate 1. A buffer layer 2 is grown over the substrate 1, and a first (in this case, n-type) cladding region 3 is grown over the buffer layer 2. An active region 4 is grown over the first cladding region 3. The active region 4 is not shown in detail in FIG. 1, but it will typically consist of a multiple quantum well (MQW) structure. A second cladding region, of opposite conductivity type to the first cladding region 3, is then grown over the active region 4. Since the first cladding region 3 is, in this example, an n-type cladding region, the second cladding region in this example is a p-type cladding layer. A capping layer 8 is disposed over the upper surface of the second cladding region. Electrodes (not shown) are disposed over the capping layer 8, and on the underside of the substrate 1, to allow a current to be applied to the laser device.

The self-pulsation laser device 17 of FIG. 1 further includes a layer 6 disposed within the second cladding region.

The layer 6 absorbs light emitted by the active region 4 of the device, and will be referred to as a "saturable absorbing layer". The second cladding region thus consists of a first cladding layer 5 disposed between the active region and the saturable absorbing layer 6, and a second cladding layer 7 disposed between the saturable absorbing layer 6 and the capping layer 8. The saturable absorbing layer 6 may be a quantum well layer that is thicker than the active region, and in this case the saturable absorbing layer may also be referred to as a thick quantum well or TQW. Alternatively, the saturable absorbing layer 6 may be a strained layer. The saturable absorbing layer 6 is located in the p-type cladding region, and so is preferably doped p-type to ensure that a conductive path exists through the p-cladding region.

The saturable absorbing layer 6 is positioned sufficiently close to the active region 4 so that it overlaps with an optical mode propagating in the active region 4 of the laser device 17. As explained above, the saturable absorbing layer 6 gives rise to the self-pulsation effect. The distance between the saturable absorbing layer 6 and the active region 4 can be chosen depending on the amount of overlap desired between the saturable absorbing layer 6 and the optical mode, and on the degree of absorption desired in the saturable absorbing layer.

"Improvements in mode-locked semiconductor diode lasers using monolithically integrated passive waveguides made by quantum well intermixing", by F. Camacho et al in Photonics Technology Letters, IEEE, Vol. 9, No. 9 pp 1208-1210 (1997) discloses a semiconductor laser having a saturable absorber in the laser cavity. A selective quantum well intermixing technique is used to provide absorbing and non-absorbing regions in the laser cavity. This laser does not operate in the self-pulsation regime—the paper is specifically directed to avoiding self-pulsation conditions.

SUMMARY OF THE INVENTION

A first aspect of the present invention provides a method of manufacturing a semiconductor device comprising the steps of: growing a semiconductor structure having a first cladding region, at least an active layer, a second cladding region, and a saturable absorbing layer disposed within the second cladding region; and subsequently modifying the band-gap energy of the saturable absorbing layer over one or more selected areas of the device.

In a conventional self-pulsation semiconductor laser of the type shown in FIG. 1, the absorbing properties of the saturable absorbing layer 6 are primarily dependent on the distance between the active region 4 and the saturable absorbing layer 6, and also on the width and band-gap energy of the saturable absorbing layer. These characteristics are all defined during the growth process, and so are fixed during the growth of the laser device. The prior art methods of fabricating a self-pulsation laser thus have little or no post-growth control over the properties of the saturable absorbing layer. Devices grown according to these prior art methods also have poor reliability, and this is due to the generation of heat in the saturable absorbing layer (U.S. Pat. No. 5,471,494).

In the present invention, however, the absorption characteristics of the saturable absorbing layer may be changed after the device structure has been grown, without affecting the emission properties of the active region. This allows, for example, the saturable absorbing layer to be initially grown as absorbing for light emitted by the active region of the device; one or more selected areas of the saturable absorbing layer may subsequently be treated so as to increase their bandgap and so become non-absorbing for light emitted by the active region of the device. The invention thus provides an improved method of manufacturing a device such as, for example, a self-pulsation laser device.

Regions of the saturable absorbing layer that are treated so as to become non-absorbing for light emitted by the active region are able to act as a heat sink for heat generated in regions of the saturable absorbing layer that remain absorbing for light emitted by the active region.

The method may comprise increasing the band-gap energy of the one or more selected areas of the saturable absorbing layer. The saturable absorbing layer be grown with a band-gap energy that is smaller than the band-gap energy of the active region, and the method may comprise increasing the band-gap energy of the one or more selected areas of the saturable absorbing layer so as to be greater than the band-gap energy of the active region. Making the band-gap energy of the one or more selected areas greater than the band-gap energy of the active region renders said selected area non-absorbing for light emitted by the active region.

The one or more selected areas of the saturable absorbing layer may comprise substantially the entire area of the saturable absorbing layer. Thus enables the absorbing characteristics of the saturable absorbing layer to be modified over substantially its entire area. Alternatively, the band-gap energy of the saturable absorbing layer may not be intentionally altered in one or more chosen regions.

The step of modifying the band-gap energy of the saturable absorbing layer may comprise creating vacancies near a surface of the device. It may comprise creating the vacancies near a surface of the device on the opposite side of the saturable absorbing layer to the active region. The vacancies are not required to pass through the active region as they migrate into the saturable absorbing layer, and so do not affect the emission properties of the active region.

The method may comprise plasma irradiation of the surface of the device thereby to create vacancies near a surface of the device. It may comprise disposing a dielectric layer over the surface of the device before the plasma irradiation. The dielectric layer may be a silicon dioxide ($SiO_2$) layer or a silicon nitride layer.

The method may comprise the step of heating the device thereby to migrate the vacancies into the saturable absorbing layer.

The saturable absorbing layer may be a quantum well layer.

The band-gap energy of the active region may be unaltered or substantially unaltered by the step of modifying the band-gap energy of the one or more selected areas of the saturable absorbing layer. The step of modifying the band-gap energy of the one or more selected areas of the saturable absorbing layer does not affect the emission properties of the layer, in contrast to the method of Camacho et al (above).

A second aspect of the invention provides a device produced by the first aspect. The device may be a laser device, for example a stripe ridge laser device. It may be a self-pulsation laser device.

A third aspect of the invention provides a semiconductor device comprising an active region; a cladding region; and a saturable absorbing layer disposed within the cladding region; wherein the saturable absorbing layer comprises one portion that is absorbing for light emitted by the active region and comprises another portion that is not absorbing for light emitted by the active region.

The saturable absorbing layer may comprise a plurality of absorbing portions that are each absorbing for light emitted by the active region. It may further comprises a plurality of non-absorbing portions that are each not absorbing for light emitted by the active region. The absorbing and non-absorbing portions of the saturable absorbing layer may each be substantially stripe-shaped.

The device may be a semiconductor laser device.

The absorbing and non-absorbing portions of the saturable absorbing layer may be crossed with the lasing direction of the laser device.

The laser device may be a stripe ridge laser device, and the saturable absorbing layer may comprise a first stripe-shaped non-absorbing portion disposed substantially under and parallel to the stripe ridge. It may comprise at least a second non-absorbing portion, said second non-absorbing portion of the saturable absorbing layer not being disposed under the stripe ridge. Said second non-absorbing portion of the saturable absorbing layer may extend substantially parallel to the stripe ridge.

At least one absorbing portion of the saturable absorbing layer may be coupled, in use, to an optical mode propagating in the laser device.

The laser device may be a self-pulsation laser device.

Preferred embodiments of the present invention will now be described by way of illustrative examples with reference to the accompanying figures in which;

BRIEF DESCRIPTION OF THE DRAWINGS

FIGS. 4(a) to 4(c) show a first embodiment of a self-pulsation laser device according to the present invention;

FIG. 4(d) illustrates the manufacture of the laser device of FIG. 4(a);

FIG. 7 illustrates diffusion of vacancies into a laser device

Like reference numerals denote like components throughout the drawings.

DETAILED DESCRIPTION OF PREFERRED EMBODIMENTS

The present invention will be described with reference to a laser device. The invention is not, however, limited to use with a laser device and may be applied to other semiconductor devices.

Figure 1:
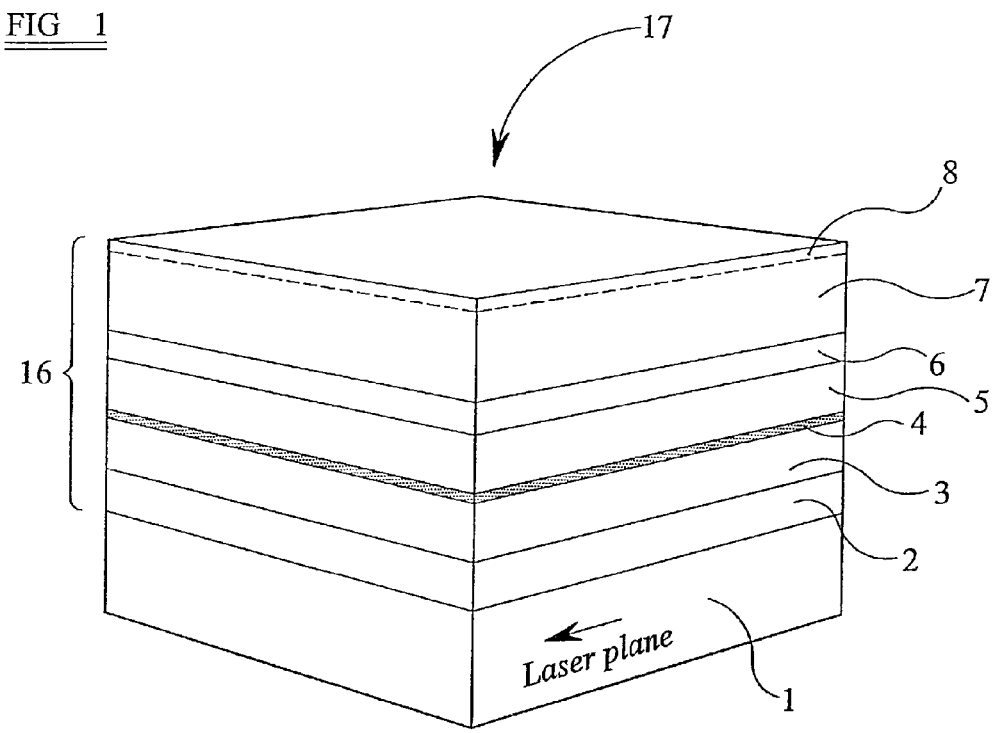
FIG. 1 is a schematic illustration of a conventional self-pulsation semiconductor laser device incorporating a saturable absorbing layer.

The fabrication method of the present invention provides a method of changing the absorption properties of the saturable absorbing layer 6 of a self-pulsation laser device having the general structure of FIG. 1 after the laser structure has been grown. Moreover, the fabrication method of invention enables the absorbing properties of the saturable absorbing layer 6 to be altered over one or more selected areas of the laser device while leaving its properties unaltered (or not intentionally altered) in non-selected areas, and this enables novel laser devices to be made. Furthermore, the fabrication method of the invention has little or no effect on the band-gap energy of the active region of the laser device, so that the emission wavelength of the laser device is not significantly affected when the properties of the saturable absorbing layer are altered. The laser structure may therefore be designed to provide a particular emission wavelength, and the final laser device will generate light of this emission wavelength regardless of the manner in which the properties of the saturable absorbing layer are altered.

In one embodiment of the fabrication method of the invention, the technique of quantum well intermixing (QWI) (John Marsh, "Compound Semiconductor", Page 63, September (2001)) is used to increase the effective band gap of the saturable absorbing layer, thereby controlling the amount of absorption in the saturable absorbing layer. Controlling the absorption in the saturable absorbing layer in this way enables the self-pulsation characteristics of the laser device to be controlled.

Figure 2:
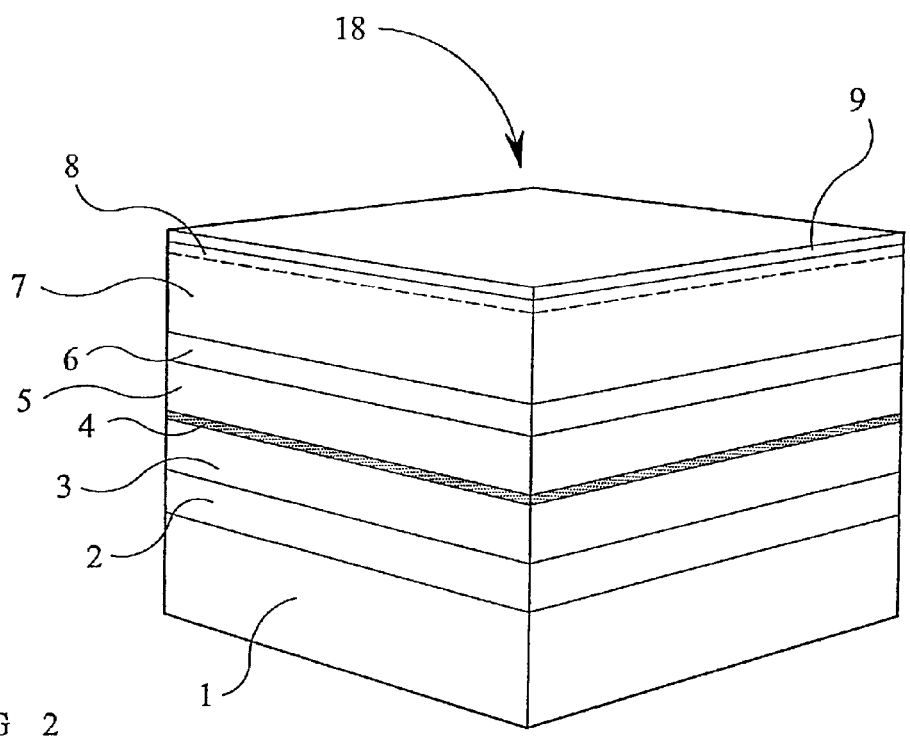
FIG. 2 illustrates a self-pulsation semiconductor laser device produced by a method of the present invention.

FIG. 2 illustrates the manufacture of a laser device according to one embodiment of the fabrication method of the invention. Fabrication of a single laser device will be described for convenience although, in general, the layer structure will be grown as a wafer having a diameter of a few inches which is then cleaved to form individual laser devices with electrodes then being provided on each individual laser device.

In this method, a laser device 18 having the same general layer structure as the laser device 17 of FIG. 1 is initially grown. The detailed description of this general layer structure will not be repeated. In this embodiment the saturable absorbing layer 6 is formed by a quantum well layer, such as a TQW, having a band-gap energy lower than the energy of photons generated in the active region. In this embodiment the saturable absorbing layer 6 is disposed within the p-type cladding region and so is preferably doped p-type.

Next, a dielectric layer 9 is deposited over the laser device, on the upper surface of the capping layer 8. Examples of suitable materials for the dielectric layer are silicon dioxide ($SiO_2$) and silicon nitride ($S_3N_4$). This layer may be deposited by plasma-enhanced chemical vapour deposition, although in principle any suitable process may be used.

Once the dielectric layer 9 has been deposited, vacancies are created within the laser device, near the surface protected by the dielectric layer 9. One convenient way of carrying out this step is to irradiate the laser device with a plasma that creates vacancies in the capping layer 8 and in the upper part of the second cladding layer 7. The dielectric layer 9 protects the surface of the laser device during this irradiation process, and reduces the number density of vacancies formed in the capping layer 8 and the cladding layer 7 as a result of the irradiation process.

Finally, the laser device 18 is annealed in order to cause the vacancies created near the surface of the laser structure to migrate through the laser structure. As vacancies migrate into the saturable absorbing layer 6, they promote quantum well intermixing and increase the effective band gap of the saturable absorbing layer 6. This enables the absorption properties of the saturable absorbing layer to be adjusted.

If desired, the dielectric layer 9 is removed after the irradiation step and a new dielectric layer is deposited over the laser device. This ensures that the upper surface of the device is relatively flat, and leads to uniform annealing of the surface (the annealing is usually performed "face down"). This enhances the intermixing that occurs as a result of the migration of vacancies induced by the annealing step. In principle, however, the dielectric layer 9 could be retained, and a new dielectric layer deposited over the dielectric layer 9. Alternatively the existing dielectric layer 9 could be retained, without deposition of a new dielectric layer.

The process of creating vacancies and annealing the laser device to cause the vacancies to migrate through the layer structure of the device does not affect the emission properties of the active region. This is because the number density of vacancies formed in the capping layer 8 and the second cladding layer 7 is low, owing to the presence of the dielectric layer during the irradiation process. This is illustrated in FIGS. 3 and 7.

Figure 3:
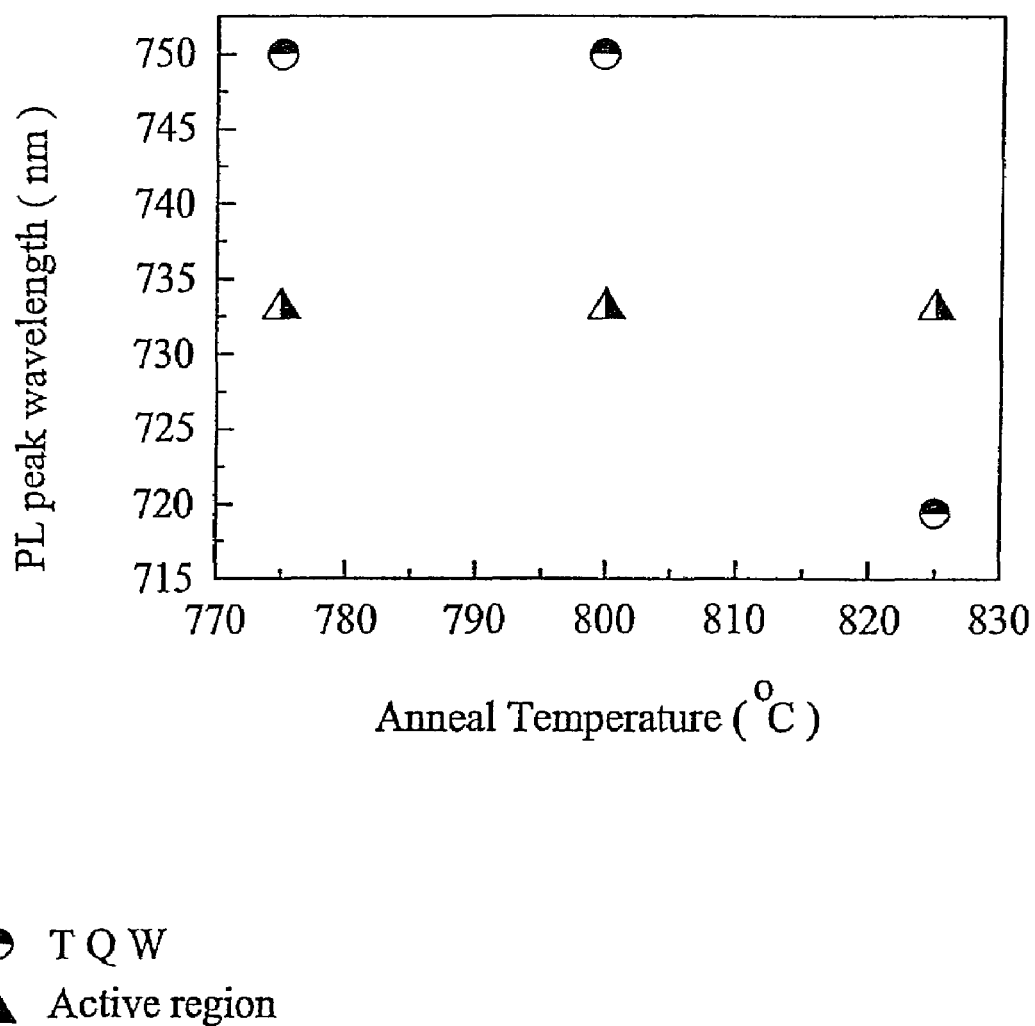
FIG. 3 shows the peak photoluminescence wavelength of a thick quantum well (TQW) and the active region of a semiconductor laser device for different annealing temperatures.

FIG. 3 shows the peak photoluminescence wavelength for the active region (triangles) and the saturable absorbing layer (circles) for a typical self-pulsation laser device of the type shown generally in FIG. 2. The peak photoluminescence wavelengths shown were measured after the irradiation and annealing processes, and are shown as a function of the annealing temperature.

The saturable absorbing layer 6 of the laser device shown in FIG. 2 is grown so as to be absorbing for light emitted by the active region 4. The saturable absorbing layer is formed by a quantum well layer having a lower band gap, and thus a lower photon energy, than the active region—and as a result the peak photoluminescence wavelength, before annealing, of the saturable absorbing layer is greater than the peak photoluminescence wavelength of the active region. In the results shown in FIG. 3, the saturable absorbing layer has a band gap corresponding to a peak photoluminescence wavelength before annealing of around 750 nm, whereas the active region has a bandgap corresponding to a peak photoluminescence wavelength before annealing of around 733 nm.

FIG. 3 illustrates the effect on the peak photoluminescence wavelengths of the active region and the saturable absorbing layer as the annealing temperature is altered. It will be seen that there is no observable effect on the peak photoluminescence wavelengths for annealing temperatures of up to around 800° C.—the peak photoluminescence wavelength of both the saturable absorbing layer and the active region remains substantially unaltered.

When the annealing temperature is raised to 825° C., however, the peak wavelength of the saturable absorbing layer region falls, to around 720 nm. This indicates that the effective band gap of the saturable absorbing layer region has increased, and is now greater than the band gap (and hence the emitted photon energy) of the active region. Thus, the saturable absorbing layer is now non-absorbing for light generated in the active region—the vacancies created by the irradiation process have migrated into the saturable absorbing layer and have caused quantum well intermixing, leading to an increase in the effective band gap of the saturable absorbing layer. It is possible to control the absorbing properties of the saturable absorbing layer in this way.

It will be seen in FIG. 3 that the peak wavelength of the active region does not change significantly for any of the annealing temperatures shown in FIG. 3. This indicates that it is possible to alter the absorbing properties of the saturable absorbing layer without having a significant effect on the emission properties of the active layer. The peak wavelengths of the active region shown in FIG. 3 are substantially equal to the peak wavelengths before the irradiation and annealing steps had been carried out.

FIG. 3 relates to the GaAs/GaAlAs system, and the minimum annealing temperature of 825° C. relates to this material system. The minimum annealing temperature is expected to be different in other material systems, but the general principle of FIG. 3 is applicable to other material systems.

FIG. 7 illustrates the effect of the dielectric layer 9 on the intermixing process. FIG. 7 shows the vacancy concentration profile (horizontal axis) as a function of the distance into the device, measured from the top surface of the device. The curve 32 in FIG. 7 illustrates the typical vacancy concentration profile obtained by irradiating the device in the absence of the dielectric layer 9 to create vacancies near the surface of the laser and subsequently annealing the device to cause the vacancies to migrate through the device. The positions of the saturable absorbing layer 6 and active region 4 are indicated schematically in FIG. 7, and it will be seen that curve 32 indicates that a number of vacancies migrate into the active region, and this would affect the emission properties of the active region.

Curve 31 in FIG. 7 shows the vacancy concentration profile obtained by irradiating the laser device when the dielectric layer 9 is present and subsequently annealing the device to cause the vacancies to migrate through the structure. It will be noted that, when the irradiation is carried out in the presence of the dielectric layer 9, vacancies do not reach the active region so that the emission properties of the active region are not altered. This is because the presence of the dielectric layer 9 reduces the number of vacancies formed near the surface of the laser device, and this is clearly shown in FIG. 7—for an given depth into the device, the vacancy concentration corresponding to curve 31 is significantly less than the vacancy concentration of curve 32.

Providing the dielectric layer 9 during the irradiation step is therefore a convenient and reliable way of ensuring that the process of creating vacancies and causing them to migrate into the saturable absorbing layer 6 does not affect the emission properties of the active region of the laser device. In principle, however, it is not necessary to provide the dielectric layer 9 during the irradiation process, provided that it is possible to ensure that the process of irradiating and annealing the device will not affect the emission properties of the laser. For example, it may be possible to control the conditions of the irradiation step to ensure that a relatively low number density of vacancies is created within the laser device even if no dielectric layer is provided, so that vacancies do not migrate as far as the active region in the subsequent annealing step.

The invention may be performed with any irradiation and annealing process that is effective to increase the band gap energy of the saturable absorbing layer 6 without subsequently affecting the emission properties of the active region 4.

The structure of the laser device 18 shown in FIG. 2 is conventional, since the saturable absorbing layer 6 is absorbing over the entire area of the laser device. However, it is possible to fabricate novel laser devices using the fabrication method of the invention.

FIG. 4(a) illustrates a first embodiment of a self-pulsation laser device of the invention. The laser device 19 of FIG. 4(a) is generally similar to the laser device of FIG. 2, except that the saturable absorbing layer 6 is not absorbing, for light emitted by the active region 4, over its entire area. In this embodiment the saturable absorbing layer 6 contains at least one region 11b that is not absorbing for light emitted by the active layer 4 and at least one region 11a that is absorbing for light emitted by the active layer 4. In the specific device shown in FIG. 4(a), the saturable absorbing layer 6 has three regions 11a that are each absorbing for light emitted by the active layer 4 and three regions 11b that are each not absorbing for light emitted by the active layer 4, but the invention is not limited to three absorbing and three non-absorbing regions. As indicated in FIG. 4(a), the absorbing regions 11a and non-absorbing regions 11b are preferably stripe-shaped, and are preferably substantially parallel to one another.

A laser device of the type shown in FIG. 4(a) may be manufactured by the fabrication process of the invention. To manufacture the laser device of FIG. 4(a), a layer structure having the same general structure as the layer structure of the laser 17 of FIG. 1 is initially produced. (The substrate 1, the buffer layer 2 and the capping layer 8 have been omitted from FIG. 4(a), for ease of description. Again, fabrication of a single laser device will be described for convenience.) The saturable absorbing layer 6 is disposed in the p-type cladding region, and so is preferably doped p-type.

Once the layer structure has been prepared, a dielectric layer 9 is deposited over the upper surface of the layer structure, as shown in FIG. 4(d) which illustrates the manufacture of the laser device of FIG. 4(a). As in the previous embodiment, the dielectric layer may be a layer of silicon dioxide or silicon nitride, and may be deposited by PECVD.

Next, strips 10a of a masking material are provided over the dielectric layer 9. In this embodiment a photoresist is used as the masking material. Photoresist is not present in the regions 10b between adjacent strips 10a of photoresist, so that the dielectric layer 9 is not covered in the regions 10b between adjacent strips 10a. FIG. 4(d) shows the layer structure after the strips 10a of photoresist have been provided.

The strips of photoresist are conveniently formed by depositing a photoresist layer over the entire dielectric layer 9, and patterning the photoresist layer by removing selected regions of the photoresist layer to leave the stripes 10a of photoresist. The layer of photoresist may be patterned using, for example, a suitable photolithographic technique.

The layer structure is then irradiated to induce vacancies within the layer structure, near the upper surface of the second cladding layer 7. The effect of the strips 10a of photoresist is to prevent formation of vacancies in regions of the second cladding layer 7 under the strips 10a of photoresist. Vacancies are created only in regions of the second cladding layer 7 that underlie the regions 10b where photoresist is not present.

Next the strips 10a of photoresist and the dielectric layer 9 material are removed, and a new dielectric layer 9' (shown in FIG. 4(a)) is deposited over the entire surface of the layer structure. Suitable materials for this new dielectric layer include silicon dioxide and silicon nitride, although other dielectric materials may be used.

The layer structure is then annealed to cause the vacancies to migrate through the layer structure.

The new dielectric layer is again deposited to provide a flat upper surface for the annealing step. In principle the existing dielectric layer 9 and the photoresist 10a could be retained and the new dielectric layer deposited over the dielectric layer 9 and photoresist 10a. This may be undesirable in practice, however, since the photoresist 10a would be baked and hardened during the annealing step, so the photoresist would then be very difficult to remove.

In the method according to this embodiment, vacancies are produced in the irradiation step only in regions of the second cladding layer 7 that underlie under the regions 10b where photoresist is not present. When the laser device is annealed, therefore, vacancies migrate only into regions 11b of the saturable absorbing layer 6 that underlie under the regions 10b where photoresist was not present during the irradiation step.

The regions 11b of the saturable absorbing layer into which vacancies migrate correspond generally in shape and size to the regions 10b where no photoresist was present during the irradiation step. No, or few, vacancies are produced in regions 11a of the saturable absorbing layer 6 that underlie positions where the strips 10a of photoresist were present during the irradiation step.

In this embodiment the saturable absorbing layer is a quantum well layer. When the laser device 19 is fabricated, the saturable absorbing layer 6 is initially grown with a band gap that is smaller than the energy of light emitted by the active region 4, so that the saturable absorbing layer 6 is absorbing for light emitted by the active region 4 over the entire area of the laser device. In the regions 11a of the saturable absorbing layer in which no vacancies are induced, the band gap of the saturable absorbing layer will not be altered, and these regions 11a of saturable absorbing layer thus remain absorbing for light emitted by the active region 4. This is shown in FIG. 4(c). The regions 11a of the saturable absorbing layer that remain absorbing for light emitted by the active region 4 are positioned generally under the positions where strips 10a of photoresist were present during the irradiation step.

In the regions 11b of the saturable absorbing layer where vacancies are induced, the absorption properties of the saturable absorbing layer 6 are modified by the vacancies. The vacancies will cause quantum well intermixing, thereby increasing the effective band gap of the saturable absorbing layer in the regions 11b of the saturable absorbing layer where vacancies are induced. Provided that sufficient vacancies are induced, the effective band gap of the saturable absorbing layer in the regions 11b will become greater than the energy of light emitted by the active region 4, so that the regions 11b of the saturable absorbing layer will become non-absorbing for light emitted by the active region 4. This is shown schematically in FIG. 4(b). The regions 11b of the saturable absorbing layer that are made non-absorbing for light emitted by the active region 4 are positioned generally under the areas 10b where photoresist was not present during the irradiation step.

This embodiment of the invention therefore enables the absorbing properties of the saturable absorbing layer to be modified, after the layer structure has been grown, in one or more selected areas—that is, in the areas 11b that underlie regions 10b where no photoresist was present during the irradiation step. The absorbing properties of the quantum well layer are substantially unchanged in non-selected areas, that is, the areas 11a that underlie the positions of the strips 10a of photoresist present during the irradiation step.

In FIG. 4(a) the areas 11a of the saturable absorbing layer that remain absorbing are arranged as a series of substantially parallel stripes. The width and separation of the stripes are defined by the width and separation of the photoresist strips 10a, which each have a width of x with the separation between two neighbouring strips 10a being y. The long axes of the absorbing areas 11a of the quantum well layer are preferably substantially perpendicular to the lasing direction of the laser device.

In the embodiment of FIG. 4(a) the areas 11a of the saturable absorbing layer that remain absorbing are crossed with the lasing direction of the laser, and are preferably substantially perpendicular to the lasing direction. This embodiment may be applied to a stripe ridge laser device, and may also be applied to an edge-emitting laser device.

Since the areas 11a of the saturable absorbing layer that remain absorbing are crossed with the lasing direction, there is considerable freedom in choosing the spacing y between adjacent photoresist strips 10a and the width x of the photoresist strips 10a while still ensuring sufficient overlap between the areas 11a of the saturable absorbing layer and the optical mode propagating in the laser. The embodiment of FIG. 4(a) is therefore relatively straightforward to fabricate.

Figure 5A:
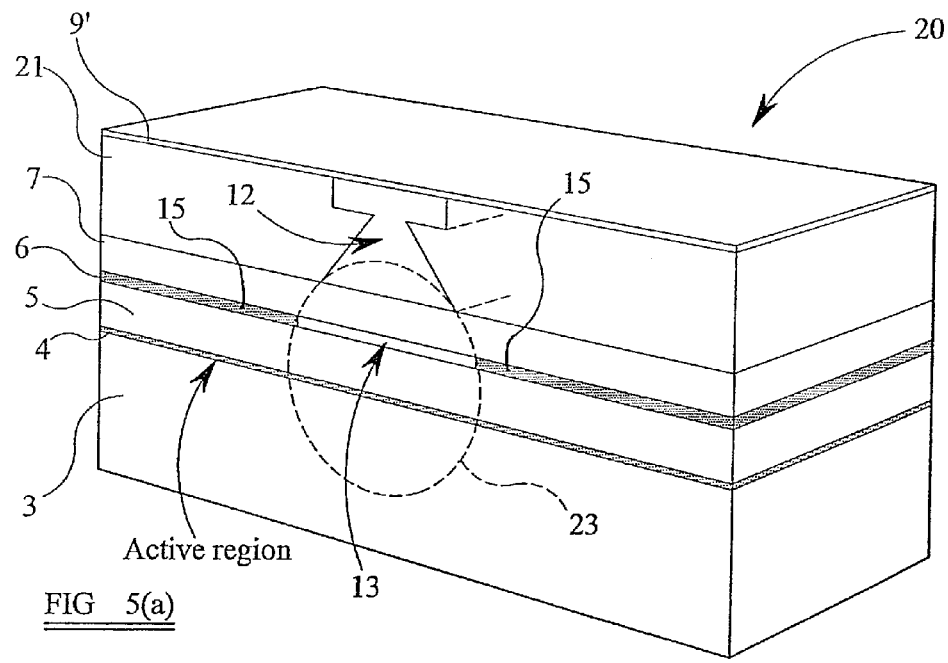
FIG. 5(a) shows a second embodiment of a self-pulsation laser device according to the present invention.

FIG. 5(a) illustrates a second embodiment of a laser device according to the invention. In this embodiment, the invention is applied to a laser having a stripe ridge. The stripe ridge laser device 20 of FIG. 5(a) is generally similar to a conventional stripe ridge laser except that the saturable absorbing layer 6 contains at least one region 15 that is/are absorbing for light emitted by the active layer 4 and at least one region 13 that is not absorbing for light emitted by the active layer 4 (and in the embodiment of FIG. 5(a) the saturable absorbing layer 6 contains two absorbing regions 15,15).

The laser structure 20 of FIG. 5(a) may be manufactured by the fabrication process of the invention. The process will be described with reference to FIG. 5(a) and to Figure (b) which illustrates an intermediate step in the manufacture.

Initially a conventional stripe ridge laser structure is produced. This laser structure has an active region 4 disposed between a first cladding region 3 and a second cladding region 5, 7. (The substrate of the laser structure, and the buffer layer between the substrate and the first cladding region 3 have been omitted from FIGS. 5(a) and 5(b).) A stripe ridge is produced over the second cladding region 5, 7, by deposition of suitable layers followed by masking and etching, and the stripe ridge is shown schematically at 12. Areas of the second cladding region 5,7 not covered by the stripe ridge 12 are covered with a current confining material 21, which is effective to confine injected current into the stripe ridge 12.

In order to provide a self-pulsation stripe ridge laser device, a saturable absorbing layer 6, for example a TQW layer, is provided within the second cladding region 5, 7. The saturable absorbing layer is grown with an initial band gap that is smaller than the photon energy of light emitted by the active region 4, so that the saturable absorbing layer is initially absorbing for light emitted by the active region as is conventional. The saturable absorbing layer 6 is provided within the p-type cladding region and so is preferably doped p-type.

According to the fabrication method of the invention, quantum well intermixing is then carried out on the portion 13 of the saturable absorbing layer that lies generally below the stripe ridge 12. This may be done by inducing vacancies in the portion 13 of the saturable absorbing layer under the stripe ridge, for example by the irradiation and annealing process described above. As explained above, this increases the bandgap energy of the saturable absorbing layer in the region 13 of the saturable absorbing layer, so that the saturable absorbing layer becomes non-absorbing for light emitted by the active region 4 in the region 13 under the stripe ridge. The non-absorbing region 13 is stripe-shaped, and extends parallel to the stripe ridge.

Figure 5B:
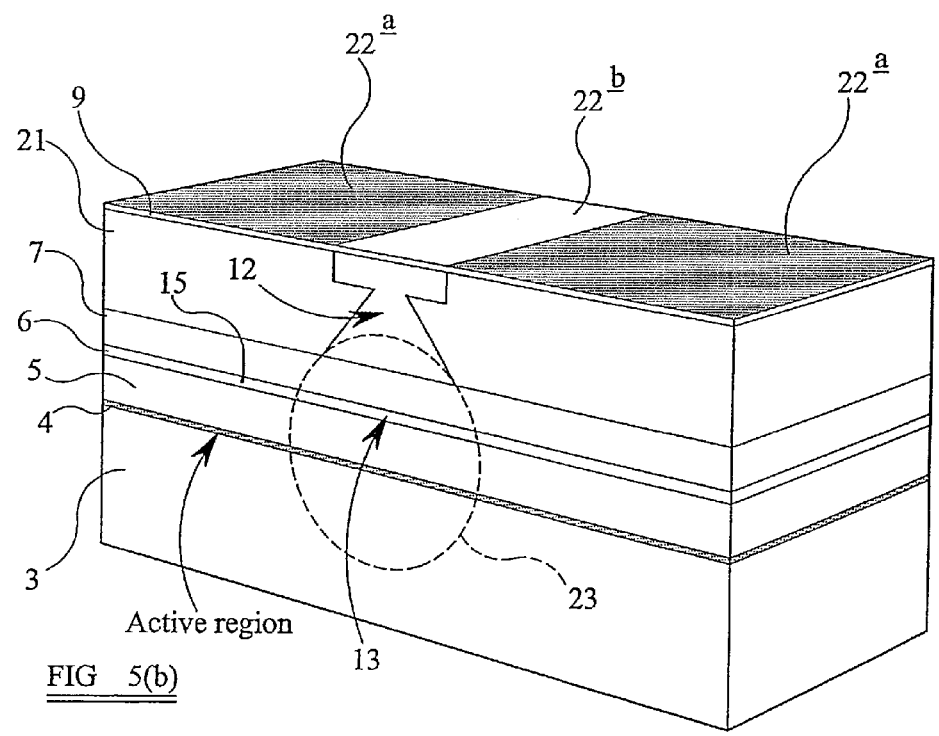
FIG. 5(b) illustrates the manufacture of the laser device of FIG. 5(a)

Further in this embodiment, the regions 15 of the saturable absorbing layer that do not lie under the stripe ridge 12 preferably do not have their band gap altered. This may be done by, for example, applying a suitable masking material 22a over the upper surface of the laser device, except for an area 22b that substantially corresponds to the ridge stripe 12. This is shown in FIG. 5(b), which illustrates the manufacture of the device of FIG. 5(a). The masking material 22a prevents the formation of vacancies in any areas of the laser device that lie under the masking material 22a and, as a results, the irradiation and annealing steps produce no or few vacancies in the regions 15 of the saturable absorbing layer that lie under the masking material 22a. The band-gap energy of the regions 15 of the saturable absorbing layer that lie under the masking material 22a is therefore not changed by the irradiation/annealing steps, and so these regions remain absorbing for light emitted by the active region 4.

In this embodiment the masking material 22a may be a photoresist. The photoresist may be deposited over the entire surface of the laser device, and patterned to remove photoresist from an area 22b that substantially corresponds to the ridge stripe 12 so that the dielectric layer 9 is exposed in the area 22b. The device is then irradiated, and the photoresist 22a and the dielectric layer 9 are removed. A new dielectric layer 9' is then deposited over the entire area of the device, and the device is then annealed.

The extent of the laser's output optical mode is indicated by the broken circle 23 in FIG. 5(a). The amount of optical absorption in the laser's cavity is determined by the coupling between the absorbing regions 15 of the saturable absorbing layer 6 and the optical mode. The area of the laser in which vacancies are induced, and hence the area of the non-absorbing region 13 of the saturable absorbing layer 6 may be chosen so as to provide the desired coupling and hence the desired amount of absorption.

Figure 6A:
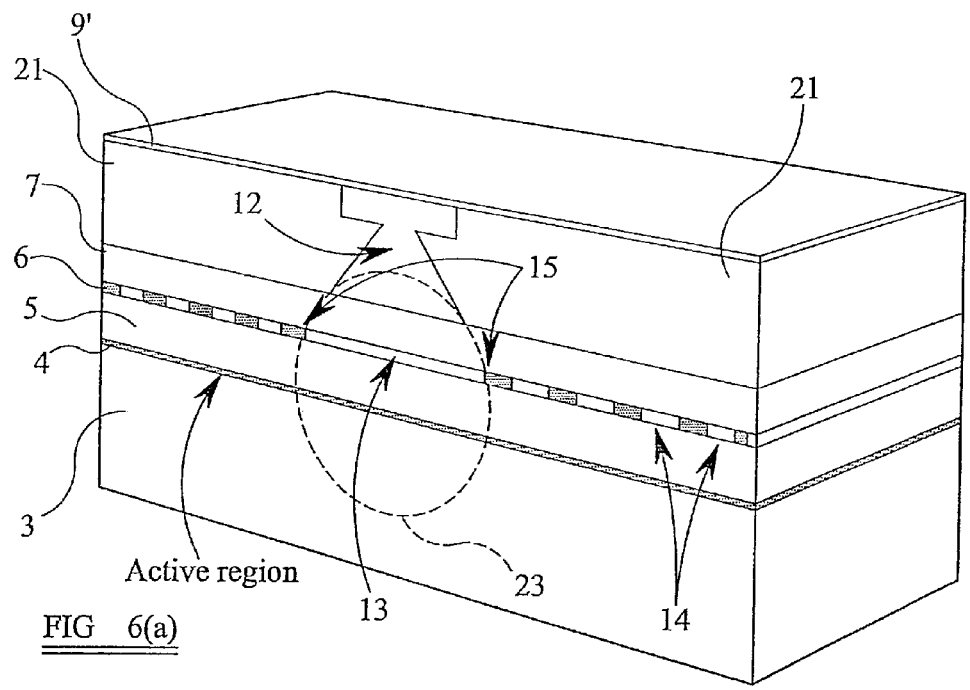
FIG. 6(a) shows a third embodiment of a self-pulsation laser device according to the present invention.

FIG. 6(a) shows a third embodiment of a laser device of the invention. This embodiment again relates to a stripe ridge laser and is generally similar to the embodiment of FIG. 5(a). In the embodiment of FIG. 6(a), however, one or more regions 14 of the saturable absorbing layer 6 (which may again be a TQW layer) that do not underlie the stripe ridge 12 are non-absorbing for light emitted by the active layer 4. These non-absorbing regions 14 are in addition to the non-absorbing region 13 of the saturable absorbing layer that generally underlies the striped ridge 12. The additional non-absorbing regions 14 of the quantum well layer 6 are generally stripe-shaped, and extend substantially parallel to the stripe ridge 12.

Figure 6B:
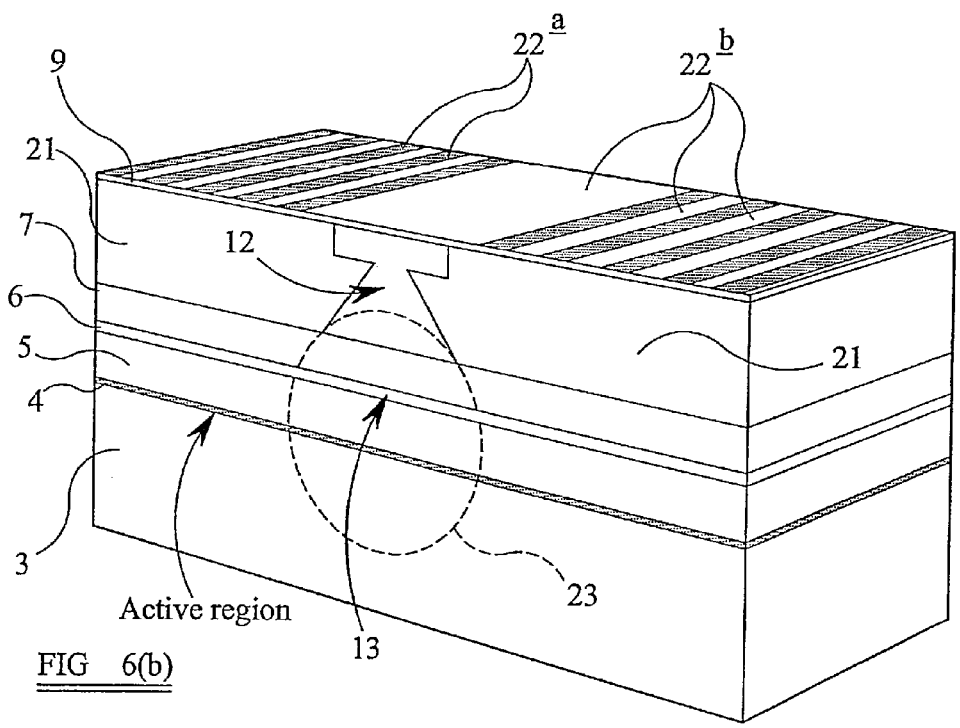
FIG. 6(b) illustrates the manufacture of the laser device of FIG. 6(a)

The laser structure of FIG. 6(a) is manufactured in a similar way to the laser structure of FIG. 5(a). However, the masking material is provided on the upper surface of the laser device in stripes 22a, as shown in FIG. 6(b). The stripes 22a correspond to the regions where the saturable absorbing layer is desired to remain absorbing for light emitted by the active region 4. The stripes 22a of masking material preferably extend substantially parallel to the direction of the stripe ridge 12 and do not overlie the stripe ridge 12, as shown in FIG. 6(b).

In this embodiment the masking material 22a may be a photoresist. The photoresist may be deposited over the entire surface of the laser device, and patterned to remove photoresist from areas 22b so that the dielectric layer 9 is exposed in the areas 22b. The device is then irradiated, and the photoresist strips 22a and the dielectric layer 9 are removed. A new dielectric layer 9' is then deposited over the entire area of the device, and the device is then annealed.

When the laser device is irradiated and annealed, quantum well intermixing occurs in all regions of the saturable absorbing layer 6 that are not underneath one of the stripes 22a of masking material. As a result, therefore, regions 14 of the saturable absorbing layer 6 that do not underlie the stripe ridge 12 are made non-absorbing for light emitted by the active region 4. The non-absorbing regions 14 of the saturable absorbing layer each underlie a gap 22b between adjacent stripes 22a of the masking material.

In addition to the regions 14 in which the saturable absorbing layer is made non-absorbing for light emitted by the active region 4, the region 13 of the saturable absorbing layer 6 that underlies the striped ridge also has its band gap increased so as to become non-absorbing for the light emitted by the active region 4.

Areas 15 of the saturable absorbing layer 6 that underlie one of the stripes 22a of masking material do not have their effective band gap changed, since no vacancies are created under the stripes 22a of masking material. The regions 15 of saturable absorbing layer 6 that underlie the stripes 22a of masking material therefore remain absorbing for light emitted by the active region 4.

The invention has been described hereinabove with reference to a conventional laser (FIG. 4(a)) and to a stripe ridge laser (FIG. 5(a), 6(a)). The invention is not, however, limited to use in fabricating these two types of semiconductor lasers. The invention may be applied to any self-pulsation semiconductor laser device and so may be applied to a self-pulsation vertical cavity surface emitting laser (VCSEL).

Once the devices shown in FIGS. 4(a), 5(a) and 6(a) have been produced, they may be subject to further processing steps. For example, the dielectric layer 9' may be removed and contacts deposited. Alternatively, additional growth or processing steps may be carried out after the dielectric layer 9' has been removed, for example to define a ridge structure. These processing steps are conventional, and will not be described here.

In the embodiments of FIGS. 5(b) and 6(b) the existing dielectric layer 9 and the photoresist 22a could be retained and the new photoresist layer 9' deposited over the dielectric layer 9 and the photoresist 22a, as described above with reference to FIGS. 4(a) and 4(d).

As noted above, the invention may also be applied to other semiconductor devices in addition to lasers.

The invention claimed is:

1. A method of manufacturing a semiconductor device comprising the steps of:
   growing a semiconductor layer structure having at least an active region, a cladding region, and a saturable absorbing layer disposed within the cladding region; and
   subsequently modifying the band-gap energy of one or more selected areas of the saturable absorbing layer.

2. A method as claimed in claim 1 and comprising increasing the band-gap energy of the one or more selected areas of the saturable absorbing layer.

3. A method as claimed in claim 1 and comprising: growing the saturable absorbing layer with a band-gap energy that is smaller than the band-gap energy of the active region; and increasing the band-gap energy of the one or more selected areas of the saturable absorbing layer so as to be greater than the band-gap energy of the active region.

4. A method as claimed in claim 1 wherein the one or more selected areas of the saturable absorbing layer comprises substantially the entire area of the saturable absorbing layer.

5. A method as claimed in claim 1 wherein the step of modifying the band-gap energy of the saturable absorbing layer comprises creating vacancies near a surface of the device.

6. A method as claimed in claim 5 and comprising creating the vacancies near a surface of the device on the opposite side of the saturable absorbing layer to the active layer.

7. A method as claimed in claim 5 and comprising plasma irradiation of the surface of the device thereby to create vacancies near a surface of the device.

8. A method as claimed in claim 7 and comprising disposing a dielectric layer over the surface of the device before the plasma irradiation.

9. A method as claimed in claim 8 wherein the dielectric layer is a silicon dioxide ($SiO_2$) layer or a silicon nitride layer.

10. A method as claimed in claim 6 and comprising the step of heating the device thereby to migrate the vacancies into the saturable absorbing layer.

11. A method as claimed in claim 10 wherein the saturable absorbing layer is a quantum well layer.

12. A method as claimed in claim 1 wherein the band-gap energy of the active region is unaltered or is substantially unaltered by the step of modifying the band-gap energy of the one or more selected areas of the saturable absorbing layer.

13. A device produced by a method as defined in claim 1.

14. A device as claimed in claim 13 and comprising a semiconductor laser device.

15. A device as claimed in claim 14 and comprising a stripe ridge laser.

* * * * *